United States Patent [19]
Oh

[11] Patent Number: 5,636,169
[45] Date of Patent: Jun. 3, 1997

[54] PRECHARGE VOLTAGE GENERATOR

[75] Inventor: Young N. Oh, Bubal-eub, Rep. of Korea

[73] Assignee: Hyundai Electronics Industries Co. Ltd., Ichon-kun, Rep. of Korea

[21] Appl. No.: 358,755

[22] Filed: Dec. 19, 1994

[30] Foreign Application Priority Data

Dec. 23, 1993 [KR] Rep. of Korea ............ 1993-29287

[51] Int. Cl.$^6$ ........................................... G11C 11/24
[52] U.S. Cl. ............................. 365/203; 365/226
[58] Field of Search .................. 365/203, 226; 327/536, 537

[56] References Cited

U.S. PATENT DOCUMENTS

| | | | |
|---|---|---|---|
| 4,941,128 | 7/1990 | Wada | 365/203 |
| 5,113,088 | 5/1992 | Yamamoto | 327/537 |
| 5,255,232 | 10/1993 | Foss | 365/203 |
| 5,315,554 | 5/1994 | Nanba | 365/201 |

Primary Examiner—A. Zarabian
Attorney, Agent, or Firm—Gary M. Nath; Nath & Associates

[57] ABSTRACT

An improved precharge voltage generator for a semiconductor memory device having a bit line connected to a plurality of memory cell arrays. The improved precharge voltage generator employs a voltage divider for dividing a supply voltage and supplying the divided voltage as a precharge voltage signal to the bit line, and a first control current sink connected in parallel to the voltage divider to increase an amount of current of the precharge voltage signal to be supplied to the bit line in an active mode of the semiconductor memory device. The improved precharge voltage generator can use a second control current sink connected in parallel to the voltage divider to increase the current amount of the precharge voltage signal to be supplied to the bit line for a predetermined time period from an end time point of the active mode of the semiconductor memory device. According to the present invention, the improved precharge voltage generator can enhance the equalizing speed of the bit line of the semiconductor memory device to enhance the successive data access speed of the semiconductor memory device.

6 Claims, 2 Drawing Sheets

PRECHARGE VOLTAGE GENERATOR

BACKGROUND OF THE INVENTION

1. Field of the Invention

The present invention relates in general to a circuit for generating a voltage for precharging a bit line or a data line of a semiconductor memory device, and more particularly to an improved precharge voltage generator for equalizing the bit line or the data line of the semiconductor memory device at a high speed to enhance the data access speed of the semiconductor memory device.

2. Description of the Prior Art

Generally, a precharge voltage generator charges a bit line or a data line of a semiconductor memory device before data is transferred in order to enhance the transfer speed of the data. To this end, the precharge voltage generator applies a precharge voltage to the bit line or the data line of the semiconductor memory device, the precharge voltage having a value corresponding to half that of a supply voltage, namely, (Vcc–Vss)/2.

The bit line or the data line of the semiconductor memory device is precharged with the precharge voltage of (Vcc–Vss)/2 from the precharge voltage generator in a standby mode. On the contrary, in an active mode, the bit line or the data line of the semiconductor memory device is maintained at a supply voltage Vcc or a ground voltage Vss by a sense amplifier which senses and amplifies bit data from a memory cell array. When the semiconductor memory device is changed from the active mode to the standby mode, the supply voltage Vcc or the ground voltage Vss on the bit line or the data line of the semiconductor memory device must be recovered to the precharge voltage of (Vcc–Vss)/2 as soon as possible.

However, such a conventional precharge voltage generator is desirable to regulate the level of the precharge voltage with a variation in the level of the supply voltage, but has a disadvantage in that it has no function of adjusting an amount of current as the semiconductor memory device is changed in mode, resulting in no improvement in the speed at which the supply voltage vcc or the ground voltage vss on the bit line or the data line of the semiconductor memory device is recovered to the precharge voltage of (Vcc–Vss)/2. For this reason, the semiconductor memory device cannot access the data at a high speed because of a long standby time between the data access modes. Such a problem with the conventional precharge voltage generator will hereinafter be described in detail with reference to FIG. 1.

Referring to FIG. 1, there is shown a circuit diagram of the conventional precharge voltage generator. As shown in this drawing, the conventional precharge voltage generator comprises a first voltage divider 10 for generating first and second divided-voltage signals, and a second voltage divider 12 for generating the precharge voltage in response to the first and second divided-voltage signals from the first voltage divider 10.

The first voltage divider 10 includes a first PMOS transistor. Q1 connected between a supply voltage source Vcc and a first node N1, a first NMOS transistor Q2 connected between the first node N1 and a second node N2, a second PMOS transistor Q3 connected between the second node N2 and a third node N3, and a second NMOS transistor Q4 connected between the third node N3 and a ground voltage source Vss. The first divided-voltage signal $V_{D1}$ is generated at the first node N1 and has a voltage value determined by the following equation (1):

$$V_{D1}=(R_{Q2}+R_{Q3}+R_{Q4})\times Vcc/(R_{Q1}+R_{Q2}+R_{Q3}+R_{Q4}) \quad (1)$$

where, $R_{Q1}$, $R_{Q2}$, $R_{Q3}$ and $R_{Q4}$ are resistances of the first PMOS transistor Q1, the first NMOS transistor Q2, the second PMOS transistor Q3 and the second NMOS transistor Q4, respectively.

The second divided-voltage signal $V_{D2}$ is generated at the third node N3 and has a voltage value determined by the following equation (2):

$$V_{D2}=R_{Q4}\times Vcc/(R_{Q1}+R_{Q2}+R_{Q3}+R_{Q4}) \quad (2)$$

The first and second divided-voltage signals $V_{D1}$ and $V_{D2}$ are varied in level with a variation in a level of the supply voltage Vcc.

The second voltage divider 12 includes a third NMOS transistor Q5 connected between the supply voltage source Vcc and an output node N4, and a third PMOS transistor Q6 connected between the output node N4 and the ground voltage source Vss. The third NMOS transistor Q5 has a gate for inputting the first divided-voltage signal $V_{D1}$ from the first node N1 and the third PMOS transistor Q6 has a gate for inputting the second divided voltage signal $V_{D2}$ from the third node N3. The third NMOS transistor Q5 has a resistance which is gradually increased as the first divided-voltage signal $V_{D1}$ from the first node N1 is reduced in level. On the contrary, the third PMOS transistor 06 has a resistance which is reduced as the second divided-voltage signal $V_{D2}$ from the third node N3 is reduced in level. In result, the third NMOS transistor Q5 and the third PMOS transistor Q6 generate the precharge voltage of (Vcc–Vss)/2 which is increased or reduced in level as the supply voltage (vcc–Vss) is increased or reduced in level. The generated precharge voltage of (Vcc–Vss)/2 is outputted through the output node N4. As the supply voltage (Vcc–Vss) is varied in level, the precharge voltage of (Vcc–Vss)/2 is increased or reduced to have a value of half that of the supply voltage (vcc–Vss).

As mentioned above, the conventional precharge voltage generator has only the function of generating the precharge voltage having the value corresponding to half that of the supply voltage, regardless of the variation in the mode of the semiconductor memory device. For this reason, the conventional precharge voltage generator cannot adjust an amount of current as the semiconductor memory device is changed in mode. As a result, much time is required in recovering the supply voltage or the ground voltage on the bit line or the data line of the semiconductor memory device to the precharge voltage when the semiconductor memory device is changed from the active mode to the standby mode. This results in a degradation in the successive data access operation of the semiconductor memory device.

SUMMARY OF THE INVENTION

Therefore, the present invention has been made in view of the above problem, and it is an object of the present invention to provide an improved precharge voltage generator for enhancing an equalizing speed of a bit line or a data line of a semiconductor memory device to enhance the successive data access speed of the semiconductor memory device.

In accordance with one aspect of the present invention, in a semiconductor memory device having a bit line connected to a plurality of memory cell arrays, there is provided an improved precharge voltage generator comprising a voltage dividing means for dividing a supply voltage and supplying the divided voltage as a precharge voltage signal to said bit line, and a control current sink connected in parallel to said voltage dividing means to increase an amount of current of the precharge voltage signal to be supplied to said bit line for a predetermined time period from an end time point of an active mode of said semiconductor memory device.

In accordance with another aspect of the present invention, in a semiconductor memory device having a bit line connected to a plurality of memory cell arrays, there is provided an improved precharge voltage generator comprising voltage dividing means for dividing a supply voltage and supplying the divided voltage as a precharge voltage signal to said bit line, and a control current sink connected in parallel to said voltage dividing means to increase an amount of current of the precharge voltage signal to be supplied to said bit line in an active mode of said semiconductor memory device.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
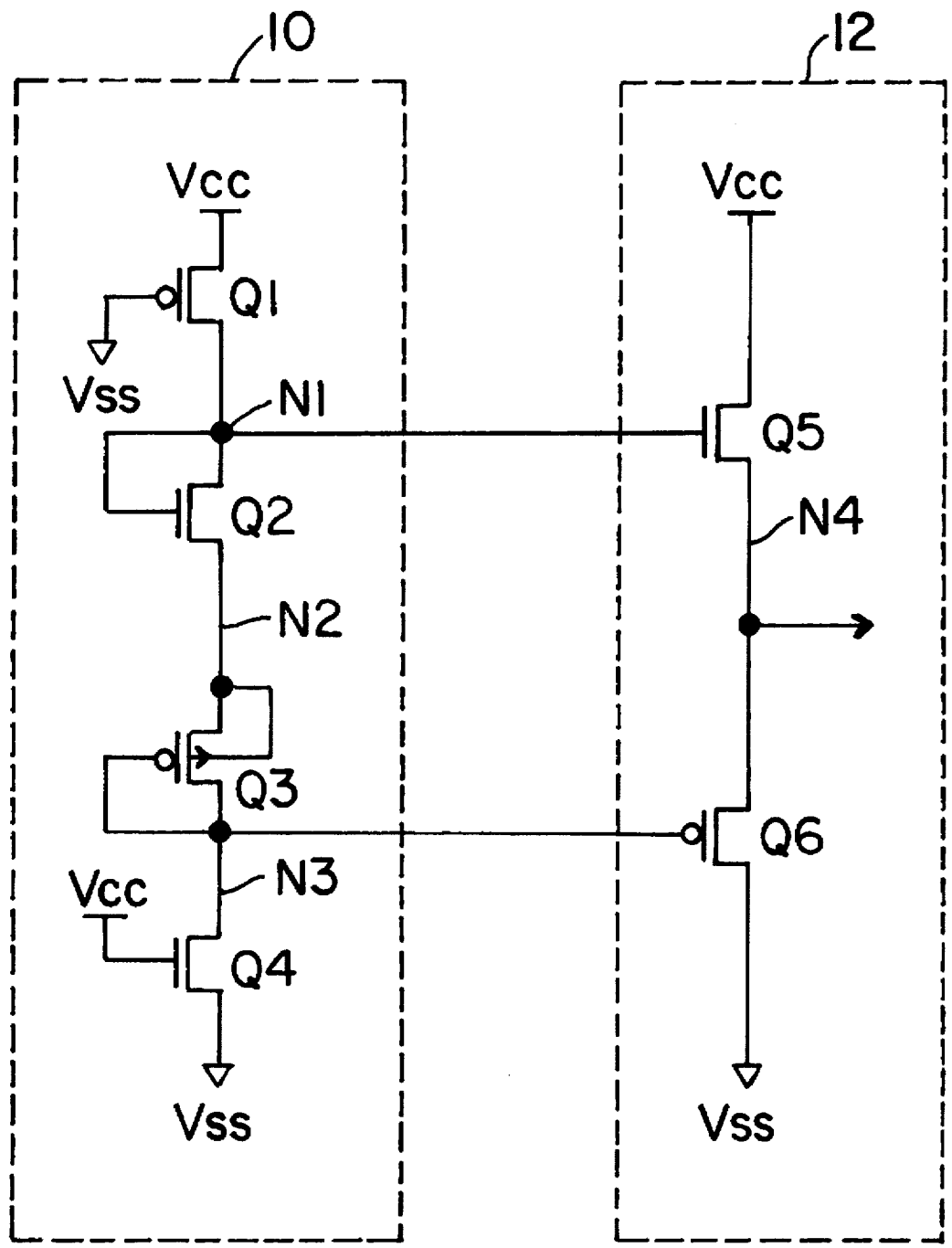
FIG. 1 is a circuit diagram of a conventional precharge voltage generator.
Figure 2:
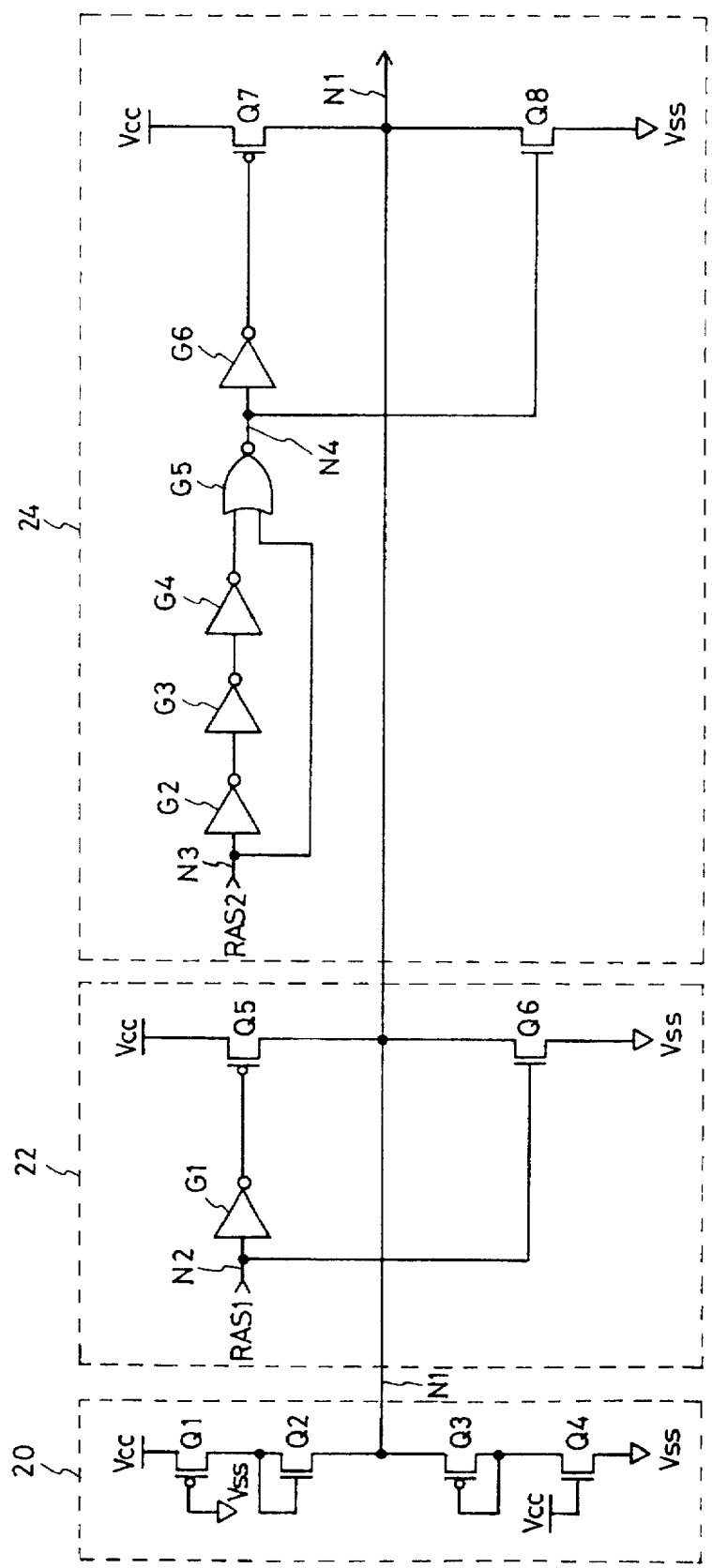
FIG. 2 is a circuit diagram of an improved precharge voltage generator in accordance with an embodiment of the present invention.

Referring to FIG. 2, there is shown a circuit diagram of an improved precharge voltage generator in accordance with an embodiment of the present invention. As shown in this drawing, the improved precharge voltage generator comprises a voltage divider 20, and first and second control current sinks 22 and 24 connected in parallel between a supply voltage source Vcc and a ground voltage source Vss.

The voltage divider 20 includes a first PMOS transistor Q1 and a first NMOS transistor Q2 connected in series between the supply voltage source Vcc and an output node N1, and a second PMOS transistor Q3 and a second NMOS transistor Q4 connected in series between the output node N1 and the ground voltage source Vss. The first PMOS transistor Q1 has a gate connected to the ground voltage source Vss. As a result, the first PMOS transistor Q1 functions as a fixed resistor having a fixed resistance. Also, the second NMOS transistor Q4 has a gate connected to the supply voltage source Vcc. As a result, the second NMOS transistor Q4 functions as a fixed resistor having a fixed resistance. On the other hand, the first NMOS transistor Q2 has a gate connected to a drain thereof. As a result, the first NMOS transistor Q2 acts as an active resistor having a resistance which is reduced as a supply voltage from the supply voltage source Vcc is increased in level. Also, the second PMOS transistor Q3 has a gate connected to a drain thereof. As a result, the second PMOS transistor Q3 acts as an active resistor having a resistance which is increased as the supply voltage from the supply voltage source Vcc is increased in level. Because the resistances of the first NMOS transistor Q2 and the second PMOS transistor 93 are varied complementarily to each other as the supply voltage from the supply voltage source Vcc is varied in level, a precharge voltage of (Vcc−Vss)/2 is generated at the output node N1, the precharge voltage always having a value corresponding to half that of the supply voltage from the supply voltage source Vcc. The first NMOS transistor Q2 and the second PMOS transistor Q3 have channel widths narrower than those of the second NMOS transistor Q4 and the first PMOS transistor Q1 to maintain their resistances higher than those of the second NMOS transistor Q4 and the first PMOS transistor Q1. Because of the higher resistances of the first NMOS transistor Q2 and the second PMOS transistor Q3, the voltage divider 20 minimizes power consumption in a standby mode of a semiconductor memory device.

The first control current sink 22 includes a third PMOS transistor Q5 connected between the supply voltage source Vcc and the output node N1, a third NMOS transistor Q6 connected between the output node N1 and the ground voltage source Vss, and an inverter G1 for inputting a first low address strobe signal RAS1 from a first input node N2. The inverter G1 is adapted to invert the first row address strobe signal RAS1 from the first input node N2 and supply the inverted first row address strobe signal to a gate of the third PMOS transistor Q5. While the output signal from the inverter G1 remains at its low logic, namely, the semiconductor memory device is in an active mode, the third PMOS transistor Q5 is turned on to act as a fixed resistor having a fixed resistance. Also, the first row address strobe signal RAS1 from the first input node N2 is directly applied to a gate of the third NMOS transistor Q6. While the first row address strobe signal RAS1 from the first input node N2 remains at its high logic, namely, the semiconductor memory device is in the active mode, the third NMOS transistor Q6 is turned on to act as a fixed resistor having a fixed resistance. In result, the third PMOS and NMOS transistors Q5 and Q6 increase an amount of current of the precharge voltage signal generated at the output node N1. For the purpose of greatly increasing the current amount of the precharge voltage signal at the output node N1, the third PMOS and NMOS transistors Q5 and Q6 have low resistances similar to those of the first PMOS transistor Q1 and the second NMOS transistor Q4. Therefore, the first control current sink 22 greatly increases the current amount of the precharge voltage signal at the output mode N1 in the active mode of the semiconductor memory device to prevent a charge amount on a bit line or a data line of the semiconductor memory device from being reduced below a threshold level and to shorten the time required in recovering a voltage on the bit line or the data line to the precharge voltage when the semiconductor memory device is changed from the active mode to the standby mode.

The second control current sink 24 includes a fourth PMOS transistor Q7 connected between the supply voltage source Vcc and the output node N1, a fourth NMOS transistor Q8 connected between the output node N1 and the ground voltage source Vss, and three inverters G2–G4 connected in series to a second input node N3. The three inverters G2–G4 are adapted to delay and invert a second row address strobe signal RAS2 from the second input node N3. In this case, a delay time of the second row address strobe signal RAS2 corresponds to the sum of propagation delay times of the three inverters G2–G4. Then, the three inverters G2–G4 supply the delayed and inverted second row address strobe signal to a NOR gate G5. The second row address strobe signal RAS2 may be obtained by delaying the first row address strobe signal RAS1 for a predetermined time period or the same as the first row address strobe signal RAS1. Also, the first row address strobe signal RAS1 may be obtained by delaying an external row address strobe signal RAS for a predetermined time period, the external row address strobe signal RAS designating the active mode of the semiconductor memory device. The NOR gate G5 NORes the output signal from the inverter series circuit G2–G4 and the second row address strobe signal RAS2 from the second input node N3 and generates the resultant pulse signal which has a high logic pulse width corresponding to the delay time of the inverter series circuit G2–G4 beginning with an end time point of the active mode of the semiconductor memory device. Then, the NOR gate G5 outputs the pulse signal to an inverter G6 and a gate of the fourth NMOS transistor Q8.

The inverter G6 inverts the pulse signal from the NOR gate G5 and applies the inverted pulse signal to a gate of the fourth PMOS transistor Q7. While the output signal from the inverter G6 remains at its low logic, the fourth PMOS transistor Q7 is turned on to act as a fixed resistor having a fixed resistance. Also, while the pulse signal from the NOR gate G5 remains at its high logic, the fourth NMOS transistor Q8 is turned on to act as a fixed resistor having a fixed resistance. In result, the fourth PMOS and NMOS transistors Q7 and 98 increase the current amount of the precharge voltage signal at the output node N1 for the delay time of the inverter series circuit G2–G4 from the moment that the semiconductor memory device is changed from the active mode to the standby mode. In order to greatly increase the current amount of the precharge voltage signal at the output node N1, the fourth PMOS and NMOS transistors Q7 and Q8 have low resistances similar to those of the first PMOS transistor Q1 and the second NMOS transistor Q4. Therefore, because the fourth PMOS and NMOS transistors Q7 and Q8 have an impedance lower than that of the voltage divider 20, the second control current sink 24 greatly increases the current amount of the precharge voltage signal to be supplied to the bit line or the data line of the semiconductor memory device for a predetermined time period from the end time point of the active mode of the semiconductor memory device to shorten the time required in recovering the voltage on the bit line or the data line to the precharge voltage when the semiconductor memory device is changed from the active mode to the standby mode. Also, the first control current sink 22 greatly increases the current amount of the precharge voltage signal at the output node N1 in the active mode of the semiconductor memory device to prevent the charge amount on the bit line or the data line of the semiconductor memory device from being excessively reduced. Therefore, the first control current sink 22 shortens even further the time required in recovering the voltage on the bit line or the data line to the precharge voltage when the semiconductor memory device is changed from the active mode to the standby mode. This results in making the difference between the voltage on the bit line or the data line and the precharge voltage as small as possible in the active mode of the semiconductor memory device.

As apparent from the above description, according to the present invention, the precharge voltage generator greatly increases the current amount of the precharge voltage signal the predetermined time period when the semiconductor memory device is changed from the active mode to the standby mode. Therefore, the precharge voltage generator of the present invention can minimize the time required in recovering the voltage on the bit line or the data line of the semiconductor memory device to the precharge voltage. Also, the precharge voltage generator of the present invention greatly increases the current amount of the precharge voltage signal in the active mode of the semiconductor memory device to shorten even further the time required in recovering the voltage on the bit line or the data line to the precharge voltage when the semiconductor memory device is changed from the active mode to the standby mode. Therefore, the precharge voltage generator of the present invention has the effect of enhancing the data access speed of the semiconductor memory device.

Although the preferred embodiments of the present invention have been disclosed for illustrative purposes, those skilled in the air will appreciate that various modifications, additions and substitutions are possible, without departing from the scope and spirit of the invention as disclosed in the accompanying claims.

What is claimed is:

1. In a semiconductor memory device having a bit line connected to a plurality of memory cell arrays, an improved precharge voltage generator comprising:

an input node for inputting a control signal in the form of a pulse, said control signal designating the active mode of said semiconductor memory device;

pulse generation means for generating a pulse signal in response to the control signal from said input node, said pulse signal remaining at a desired logic state for the predetermined time period from the in time point of the active mode of said semiconductor memory device;

first voltage dividing means for dividing a supply voltage and supplying the divided as a precharge voltage signal to said bit line;

second voltage dividing means connected in parallel to said first voltage dividing means, said second voltage dividing means being selectively driven in response to the pulse signal from said pulse generation means;

third voltage dividing means connected in parallel to said first and second voltage dividing means, said third voltage dividing means being driven in the active mode of said semiconductor memory device in response to the control signal from said input node; and a control current sink means connected in parallel to said first voltage dividing means for increasing an amount of current of the precharge voltage signal to be supplied to said bit line for a predetermined time period from an end time point of an active mode of said semiconductor memory device.

2. An improved precharge voltage generator as set forth in claim 1, wherein said second voltage dividing means has an impedance much lower than that of said first voltage dividing means to greatly increase the current amount of the precharge voltage signal at an output node.

3. An improved precharge voltage generator as set forth in claim 1, wherein said third voltage dividing means has an impedance lower than that of said first voltage dividing means to greatly increase the current amount of the precharge voltage signal at said output node.

4. In a semiconductor memory device having a bit line connected to a plurality of memory cell arrays, an improved precharge voltage generator comprising:

first voltage dividing means for dividing a supply voltage and supplying the divided voltage as a precharge voltage signal to said bit line; and a first control current sink means connected in parallel to said first voltage dividing means for providing an amount to current of the precharge voltage signal to be supplied to said bit line in an active mode of said semiconductor memory device.

5. An improved precharge voltage generator as set forth in claim 4, wherein said control current sink includes:

an input node for inputting a control signal in the form of pulse, said control signal designating the active mode of said semiconductor memory device; and second voltage dividing means connected in parallel to said first voltage dividing means, said second voltage dividing means being selectively driven in response to the control signal from said input node.

6. An improved precharge voltage generator as set forth in claim 4, further comprising:

a second control current sink means connected in parallel to said first voltage dividing means to increase the current amount of the precharge voltage signal to be supplied to said bit line for a predetermined time period from an end time point of the active mode of said semiconductor memory device.

* * * * *

UNITED STATES PATENT AND TRADEMARK OFFICE
CERTIFICATE OF CORRECTION

PATENT NO. : 5,636,169
DATED       : June 3, 1997
INVENTOR(S) :    Young N. Oh

It is certified that error appears in the above-indentified patent and that said Letters Patent is hereby corrected as shown below:

Column 6, line, 58, (claim 4)

change "amount to current of" to

- - amount of current to - -

Signed and Sealed this

Twelfth Day of August, 1997

*Attest:*

BRUCE LEHMAN

*Attesting Officer*      *Commissioner of Patents and Trademarks*